United States Patent [19]

Kammerer et al.

[11] Patent Number: 5,511,032
[45] Date of Patent: Apr. 23, 1996

[54] SOURCE PRE-CHARGE SYSTEM IN A MEMORY ARRAY

[75] Inventors: William Kammerer, Mountain View, Calif.; Baruch R. Friedlander; Yaron Slezak, both of Haifa, Israel

[73] Assignee: WaferScale Integration, Inc., Fremont, Calif.

[21] Appl. No.: 245,087

[22] Filed: May 17, 1994

[51] Int. Cl.⁶ .................................................. G11C 7/00
[52] U.S. Cl. ........................... 365/230.06; 365/189.11; 365/203; 365/204
[58] Field of Search .................................. 365/203, 204, 365/189.02, 189.11, 230.06

[56] References Cited

U.S. PATENT DOCUMENTS

| | | | |
|---|---|---|---|
| 4,387,447 | 6/1983 | Klaas et al. | 365/203 |
| 4,856,106 | 8/1989 | Teraoka | 365/203 |
| 4,920,516 | 4/1990 | Tsuchimoto | 365/203 |
| 5,182,725 | 1/1993 | Andoh et al. | 365/204 X |

FOREIGN PATENT DOCUMENTS

| | | | |
|---|---|---|---|
| 0151899 | 7/1986 | Japan | 365/204 |

*Primary Examiner*—David C. Nelms
*Assistant Examiner*—Son Dinh
*Attorney, Agent, or Firm*—Skjerven, Morrill, MacPherson, Franklin & Friel

[57] ABSTRACT

There is provided a memory array including columns of memory cells, source lines and bit lines. The memory array includes precharging apparatus which discharge selected source lines while pre-charging the array. Two embodiments of the pre-charging apparatus are provided. In both, the source lines are connected to a common bit line (CNBL) via groups of source pull-up transistors. The source lines are also connected to a source decoder. In one embodiment, the source decoder discharges selected ones of the disconnected source lines. In another embodiment, the source decoder both discharges selected ones of the disconnected source lines and connects the remaining disconnected source lines to the CNBL line.

7 Claims, 6 Drawing Sheets

SOURCE PRE-CHARGE SYSTEM IN A MEMORY ARRAY

FIELD OF THE INVENTION

The present invention relates generally to pre-charge systems for memory arrays.

BACKGROUND OF THE INVENTION

Memory arrays typically are formed of a multiplicity of symmetrical memory cells organized into columns. Each cell is formed of at least one transistor and has a gate, a source at one side and a drain on the other side. Rows of gates are connected together into word lines and columns of sources and of drains are connected together into bit lines.

In virtual ground memory arrays, where the transistors are symmetrical, the bit lines can act either as source lines or as drain lines, depending on the voltage placed on them. In non-virtual ground memory arrays, the bit lines formed of columns of sources are dedicated as source lines and the bit lines formed of columns of drains are dedicated as drain lines or "read" lines.

When reading a selected memory cell, the bit line which is the drain is precharged to a predetermined level and the memory cell is read by removing charge from the drain line. It will be appreciated by those skilled in the art that the reading time is inversely dependent on the capacitance of the drain line and that the capacitance of each drain line is a function of the accumulation of the capacitance of the many memory cells attached to it.

In order to pre-charge the bit lines, they are connected to a capacitive node, known herein as the common node bit line (CNBL), to which a pull-up transistor is connected. This is illustrated in FIG. 1 to which reference is now made.

The pre-charge system of FIG. 1 includes a CNBL line to which a multiplicity of bit lines, divided into source lines 10 and drain lines 12, are attached via equalization (EQ) transistors 14. The CNBL line is connected to a pull-up transistor 16 which attempts to pull the voltage of the bit lines up to a voltage defined by a voltage reference source Vref. The other end of the bit lines 10 and 12 are connected to a decoder 18 which determines which of the bit lines 10 and 12 are to be used to read data stored in a selected memory cell.

Once a read cycle starts, indicating that a memory cell will shortly be read, all of the EQ transistors 14 are activated in order to connect all of the bit lines 10 and 12 to the CNBL line, thereby causing, through the activity of the pull-up transistor 16, the bit lines 10 and 12 to be pre-charged to a desired voltage level. At the end of a first interval, the EQ transistors 14 connected to the source lines 10 are deactivated, thereby disconnecting the source lines 10 from the CNBL line. The EQ transistors 14 connected to the read lines 12 remain activated until the end of the pre-charge interval.

During the pre-charge interval, the decoder 18 determines which source line 10 and which read line 12 are to be utilized for reading the selected memory cell. Once the first interval is over, the selected source line 10 begins to be discharged while the read lines continue to be pre-charged. At the end of the pre-charge interval, the memory cell (not shown but between the selected source and read lines 10 and 12) can be read.

It is noted that, in the prior art pre-charge system shown in FIG. 1, the selected source line 10 is first pre-charged, only to be discharged immediately thereafter. The time allotted for pre-charging is typically the maximum time it takes for the memory array to become pre-charged. The time allotted for discharging the selected source line 10 is also the maximum time necessary. Therefore, the pre-charging causes a delay between the start of a read cycle and the time when reading actually occurs.

Furthermore, in the prior art, the read and source lines are selected only once the voltage on a word line WL, connecting a row of memory cells, has "ramped up" to its full value. This is a time-consuming process, especially if the pre-charging process takes a significant amount of time.

SUMMARY OF THE PRESENT INVENTION

It is therefore an object of the present invention to provide a pre-charge system which reduces the pre-charge time. The present invention is operative for virtual ground and non-virtual ground arrays and involves separately operating the transistors which are to connect the source lines and the read lines to the capacitive node (CNBL line). It is noted that, for the present discussion, the terms "source lines" and "read lines" indicate the bit lines which are currently acting as source and read lines, respectively. If the memory array is virtual ground, then the source and read lines are defined by address decoding. Otherwise, the source and read lines are fixed.

The transistors which connect the read lines are denoted the equalization (EQ) transistors and operate as the EQ transistors of the prior art. In accordance with a preferred embodiment of the present invention, the transistors which connect to the source lines, denoted herein the "source pull-up" (PS) transistors, are divided into a plurality of groups. Each group of PS transistors is controlled by a different control signal and the control signals are decoded from an address signal and are thus, related. When one of the control signals is inactive, its group of PS transistors is disconnected from the CNBL line. Since the control signals are dependent on the address signal, only one of them is inactive at any one time.

The source and read lines are connected to decoders which also receive the address signal. When the address signal arrives, the source decoder selects one source line from the group of disconnected source lines and begins discharging it. The remaining disconnected source lines are not discharged.

The discharging of the selected source line occurs while the other lines (connected source lines and all of the read lines but not the remaining disconnected source lines) are being pre-charged. Thus, once the other lines are fully pre-charged, the memory cell is ready to be read, without having to wait for the selected source line to be discharged.

In one embodiment, the source decoder includes a multiplicity of groups of y-select (YS) transistors, connected to the groups of source lines. The YS transistors correspond to the PS transistors and are activated, via the inverse of the control signals, in opposition to the PS transistors. Thus, when a PS transistor of a source line is activated, the YS transistor at the opposite end of the source line is deactivated. The source decoder also includes a plurality of byte select (BS) transistors formed into sets and a plurality of discharge transistors, each connected to the set of byte select transistors and to ground. The YS transistors are formed into collection having one YS transistor from each group and each BS transistor is connected to one collection of YS transistors. Activation of a group of y-select transistors, one byte select transistor and the discharge transistor discharges one of the source lines. At the same time, the corresponding group of PS transistors is deactivated.

In an alternative embodiment, the source decoder discharges one of the disconnected source lines and reconnects the remaining disconnected source lines to the CNBL line.

Moreover, in accordance with the second preferred embodiment of the present invention, the source decoder includes a plurality of byte pull-up transistors, one per BS transistor. Each byte pull-up transistor is connected to the CNBL line and to its corresponding BS transistor and is active when its corresponding BS transistor is inactive. Thus, the same signal which selects a disconnected source line for discharging activates the byte pull-up transistors to connect the remaining disconnected source lines the CNBL line.

BRIEF DESCRIPTION OF THE DRAWINGS

The present invention will be understood and appreciated more fully from the following detailed description taken in conjunction with the drawings in which.

DETAILED DESCRIPTION OF A PREFERRED EMBODIMENT

Figure 1:
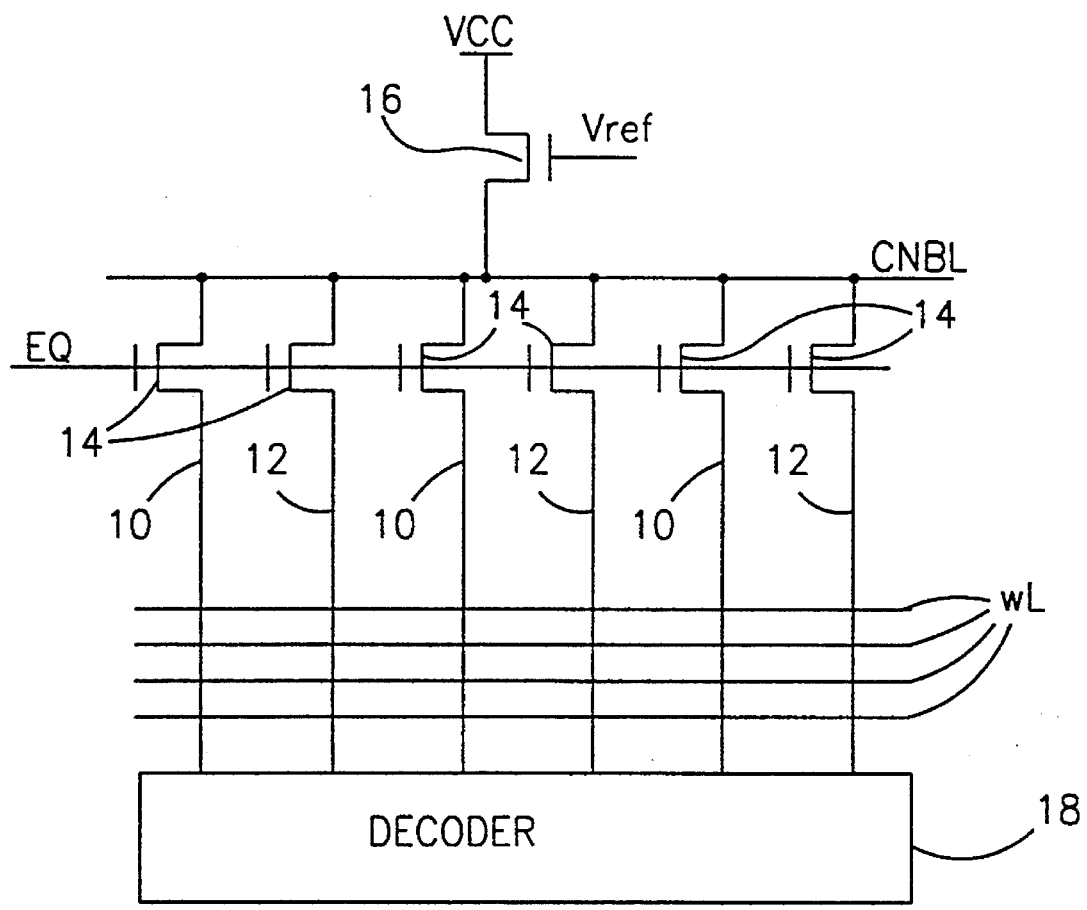
FIG. 1 is a schematic circuit diagram illustration of a prior art pre-charge system.
Figure 2:
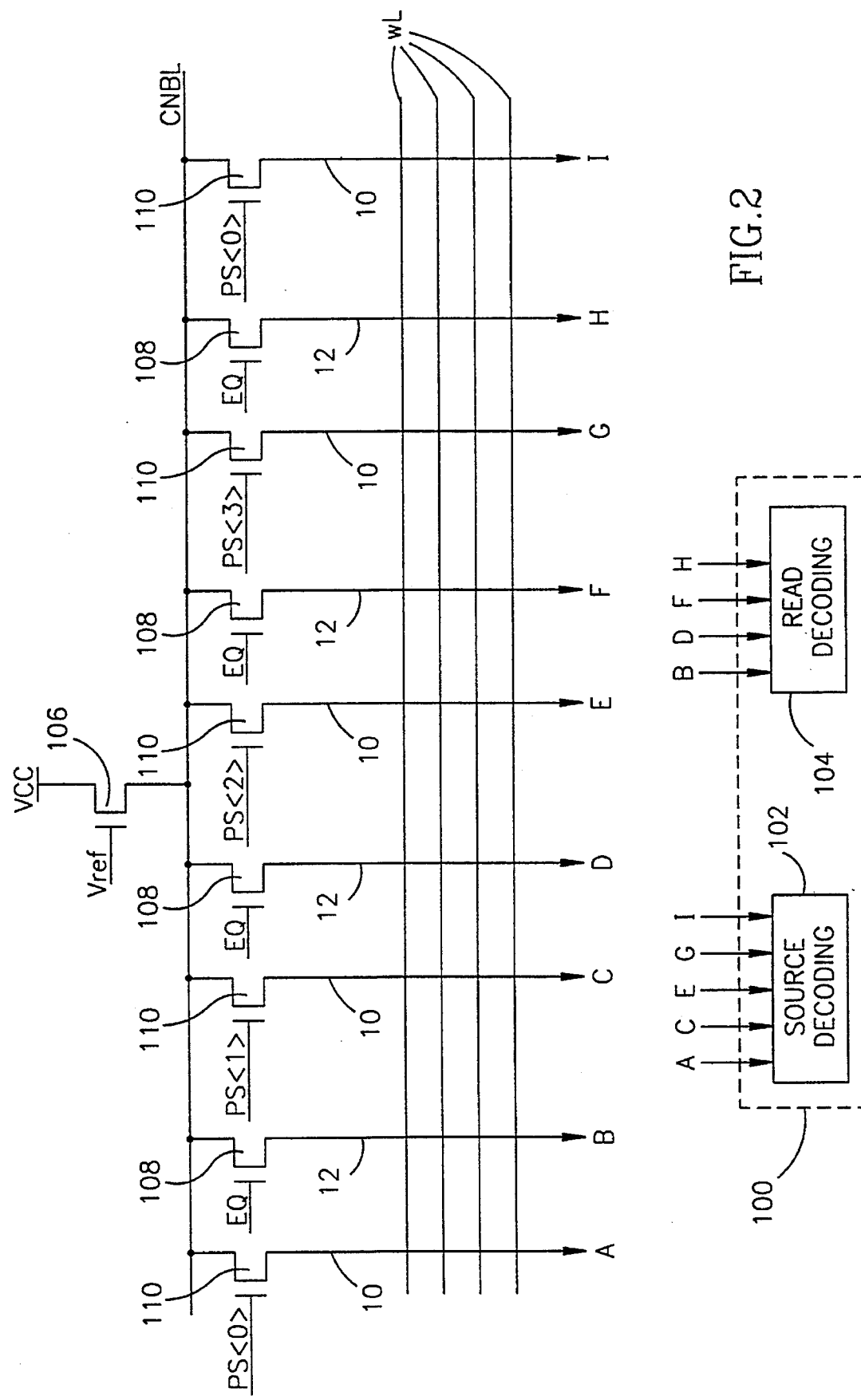
FIG. 2 is a schematic circuit diagram illustration of a pre-charge system constructed and operative in accordance with a preferred embodiment of the present invention.

Reference is now made to FIG. 2 which schematically illustrates the pre-charge system of the present invention. The present invention comprises a column multiplexer 100 connected to the entirety of bit lines 10 and 12 and separated into a source decoding portion 102 and a read decoding portion 104. The portions 102 and 104 can be permanent, if the memory array has dedicated source and read lines 10 and 12, respectively, or they can be determined by the address to be read, if the memory array has a virtual ground architecture for which the source and read lines 10 and 12, respectively, change depending on which memory cell is to be read. For the following discussion, the term "source lines" denotes the currently active source lines 10 and "read lines" denotes the currently active read lines 12.

The pre-charge system of the present invention additionally includes a pull-up transistor 106 connected to the common bit line (CNBL) and bit line activating transistors connected to the bit lines and to the CNBL line. The bit line activating transistors are formed into equalization (EQ) transistors 108 connected to the read lines and source pull-up (PS) transistors 110 connected to the source lines. The EQ transistors are controlled by an EQ line and the PS transistors 110 are controlled by one of a plurality of ps<i> lines, where i varies from 0 to 3 in the examples shown herein.

In a virtual ground architecture, the EQ and ps<i> lines are determined by decoding of the address signal indicating which memory cell is to be read.

Through the ps<i> lines, the PS transistors 110 and their corresponding source lines 10 are divided into groups. Generally, only one group is inactive at one time, becoming so when an address selection signal is provided. The other groups remain active, providing charge from the CNBL line to the source lines 10. Of the disconnected group of source lines 10, K of them, where K is typically eight (1 byte), are utilized during the reading operation.

When an address selection signal is provided, the EQ transistors 108 are activated and the address signal is at least partially decoded to provide the ps<i> signals. As a result, one group of PS transistors 110 is deactivated, thereby disconnecting their corresponding source lines 10, and the remaining groups are activated. As a result, all of the read lines 12 and all of the source 10 lines except those connected to the deactivated PS transistors 110 are connected to the CNBL line for pre-charging. Of the disconnected source lines, only K of them are discharged. The remaining ones are left floating.

The pull-up transistor 106 is always active, typically due to application of the reference voltage Vref. Therefore, when the EQ transistors 108 and some of the PS transistors 110 are activated, charge is allowed to flow from an internal supply Vcc to the connected bit lines 10 and 12. Due to space considerations, the pull-up transistor 106 cannot be very large or very strong. Moreover, it typically operates to maintain the CNBL line at 2 V with an activation signal Vref of only 3 V. Such a transistor cannot pre-charge the block within a desired pre-charge time of 5 ns without other sources of charge.

In accordance with the present invention, the source lines 10 whose PS transistors 110 are active provide charge. In the example shown in FIG. 2, one-half to three-quarters of the source lines 10 have charge at any one time and are thus available to provide charge during pre-charging. Thus, when the EQ transistors 108 connect the read lines 12 to the CNBL line, charge flows from the pull-up transistor 106 and from the connected source lines 10.

For example, a 1 Mbit EPROM array has 1024 diffusion lines, 256 of which are the source lines 10. At any given time, 128 source lines 10 are continually charged. There are 16 read lines 12 in each block which must be recharged. The 64 previously disconnected source lines 10 must also be recharged, of them, prior to recharging, eight are fully discharged and the remaining 56, which were disconnected but not utilized, are floating.

The pre-charge current is provided in the present invention, not from the pull-up transistor 106 alone which has a small drive since its gate is controlled by the voltage reference level Vref of 3 V, but also from the sources of charge listed above which are connected together through the EQ and PS transistors 108 and 110, respectively, all of whose gates are at the internal supply Vcc voltage level (5 V).

In accordance with a preferred embodiment of the present invention, while the read lines 12 and the connected source lines 10 are being pre-charged, voltage is provided on the WL connecting the K memory cells to be read, thereby to "ramp" up the word line.

To further increase the speed of access, the selected source lines (e.g. eight source lines 10 whose PS transistors 110 are already inactive) are selected and discharged by the source decoding unit 102 while the word line WL is ramping up to its full charge level. Once pre-charging has finished, all of the possible read lines 12 are already fully charged and the selected source lines discharged. The desired read lines 12 are then selected by the read decoder 104.

Figure 3A:
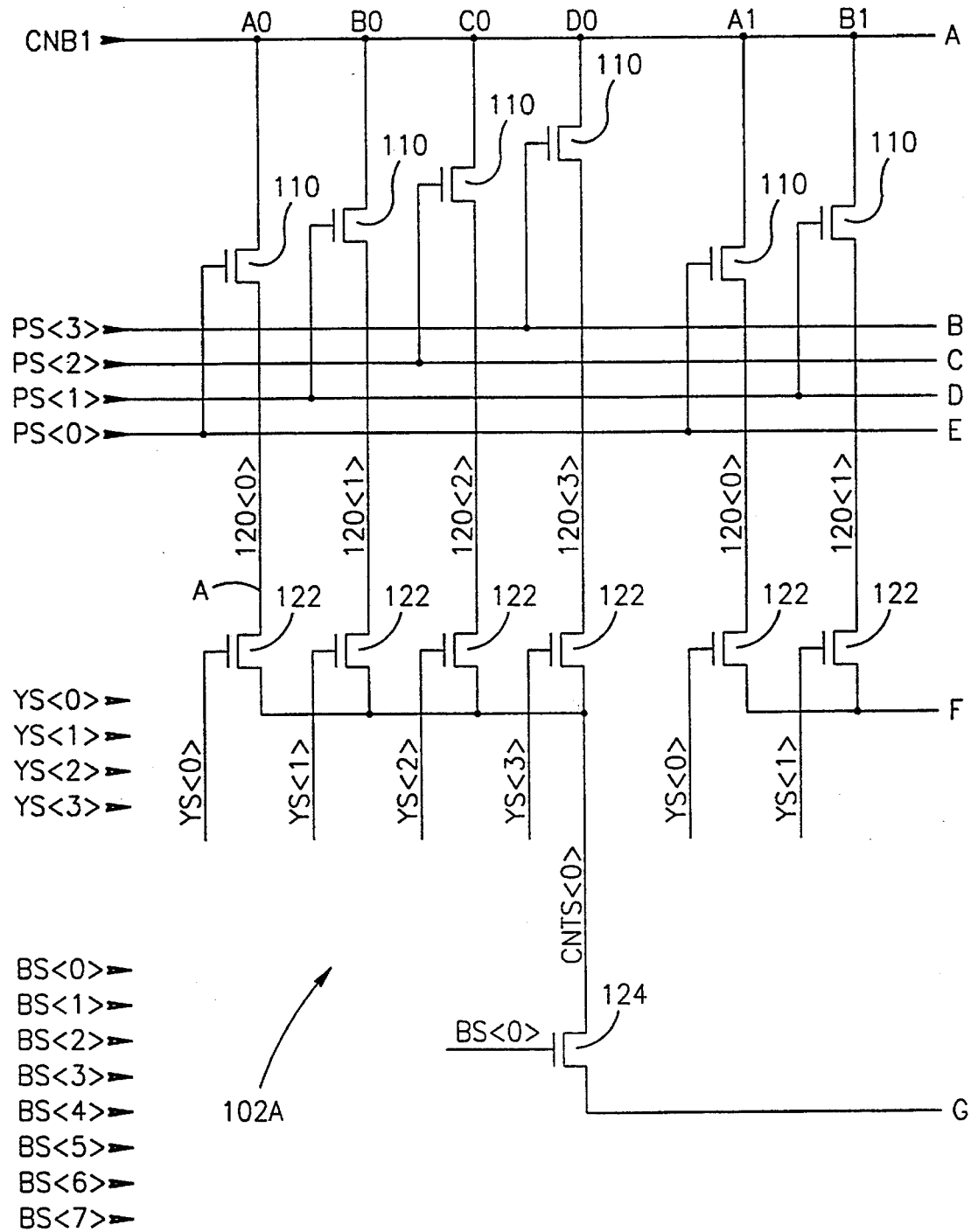
FIG. 3 is a circuit diagram illustration of a pre-charge circuit useful in the pre-charge apparatus of FIG. 2
Figure 3B:
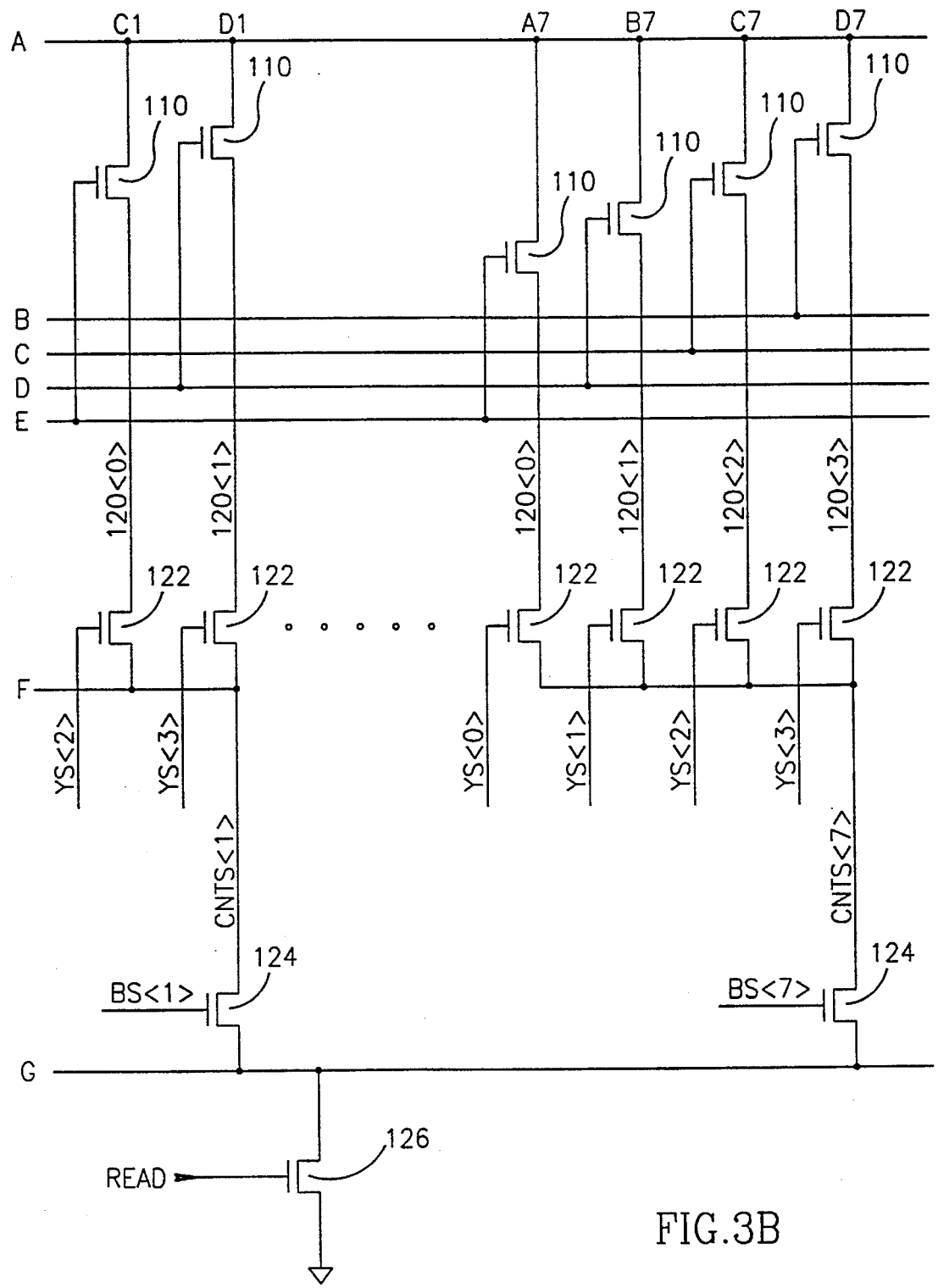
Figure 4A:
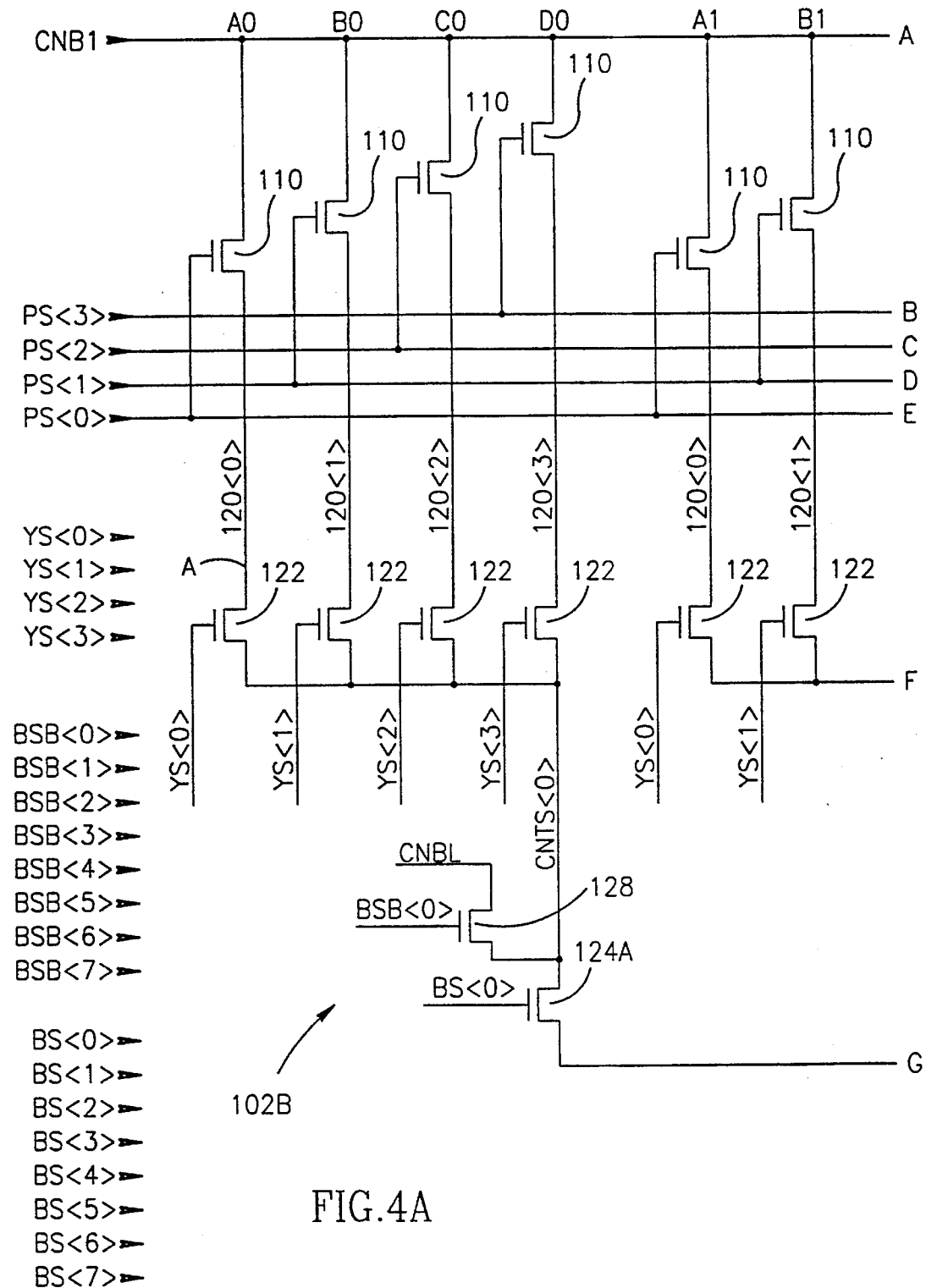
FIG. 4 is a circuit diagram illustration of an alternative embodiment of the pre-charge circuit of FIG. 2.
Figure 4B:
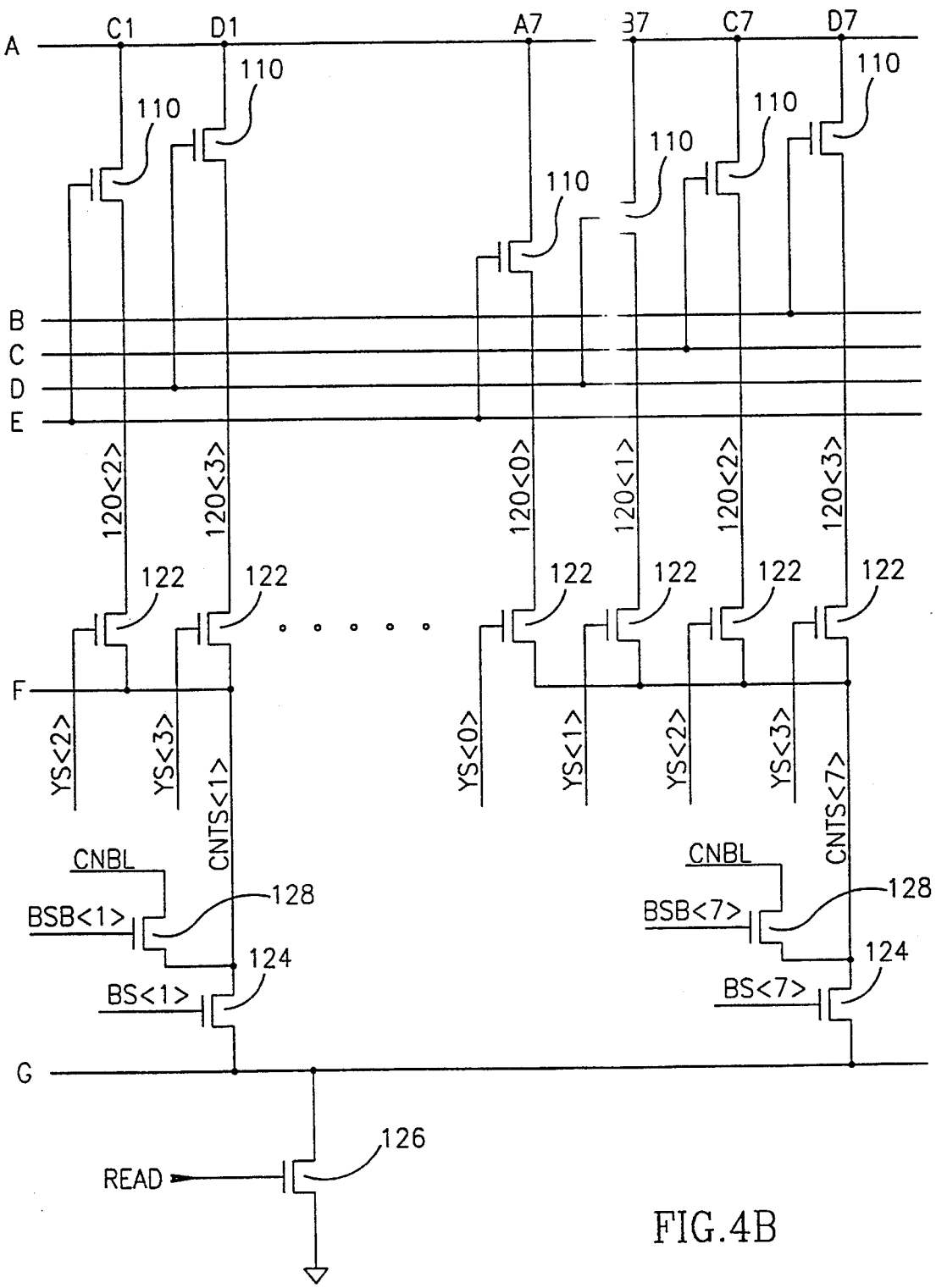

Reference is now made to FIGS. 3 and 4 which illustrate the PS transistors and two alternative exemplary embodiments of portions of the source decoding unit 102 involved in the pre-charge operations described hereinabove. FIGS. 3 and 4 illustrate the circuitry for one bit of a digital word; it will be appreciated that the circuitry is repeated throughout the memory array.

Both circuits comprise the source pull-up (PS) transistors 110, each controlled by one of N PS control lines ps<i> and each connected to the CNBL line and to a source line, labeled 120<i>. The EQ transistors 108 (FIG. 2) are not shown, nor are the read lines 12.

The N PS control lines ps<i> typically carry decoded address signals from $\log_2 N$ bits of an address signal. In the circuits of FIGS. 3 and 4, N is, for example, four. The PS control lines ps<i> serve to divide the PS transistors 110, and their corresponding source lines 120<i>, into groups.

In the circuit of FIG. 3, the source decoding unit, labeled 102a, comprises a multiplicity of y-select (YS) transistors 122, a smaller multiplicity K of byte select (BS) transistors 124 and a discharge transistor 126. K is typically a power of two and, in the examples of FIGS. 3 and 4, is eight.

YS transistors 122 are controlled by YS control lines ys<i> having the opposite bit information as the PS control lines ps<i>. YS transistors 122 are connected to the same source lines 120 as the PS transistors 110. Thus, when a group of PS transistors 110 is activated, its corresponding group of YS transistors 122 is deactivated, and vice versa.

A set of YS transistors 122, each controlled by a different ys<i> address decoded control line, is also connected to one of the BS transistors 124, each of which is controlled by a bs<j>, j=0 to K–1, control line. Only one BS transistor 124 per output signal to be produced is active at a time. The discharge transistor 126, which is connected to the BS transistors 124 and to ground, is active whenever reading occurs. When discharge transistor 126 is active, the source line 120<i> to which discharge transistor 126 is connected is discharged.

When a memory cell is to be read, a source line, for example, one of source lines 120<0>, must be discharged. The corresponding ps<i> address decoded control line ps<0> is deactivated, disconnecting the group of source lines 120<0> from the CNBL line. The corresponding ys<i> address decoded control line ys<0> is activated, thereby connecting the group of source lines 120<0> to the BS transistors 124. At the same time, one of the bs<i> control lines is also activated. Those of source lines 120<0>, which are connected, through their activated YS transistors 122, to the activated BS transistors 124 are the ones which are discharged through the discharge transistor 126. Since K BS transistors 124 are activated, only K of source lines 120<0> are discharged. For example, the source line 120<0> which is also labeled A is discharged. Those of source lines 120<0>, which are connected, through their activated YS transistors 122, to the non-activated BS transistors 124 have floating voltage levels.

Since the ps<i>, ys<i> and bs<i> control lines carry address information, the PS, YS and BS transistors 110, 122 and 124 are activated or deactivated shortly after the address signal is decoded. Since the PS, YS, BS and discharge transistors 110, 122, 124 and 126 act to discharge the source line A, the discharging operation begins as soon as the address signal is decoded.

It will be appreciated that the discharging occurs while the rest of the memory array is being equalized before the reading operation. Thus, once the equalization is finished, reading can occur. There is no need, as in the prior art, to begin discharging the selected source line 120 after equalization ends.

Unfortunately, if the non-discharged disconnected source lines 120<0> remain disconnected for a long time, they will not remain fully charged. When the ps<i> signal changes, the disconnected source lines 120<0> will be reconnected to the CNBL line and a different set of source lines 120, such as 120<1>, will be disconnected. In this situation, the 1/N previously disconnected source lines 120<0> will not only have little charge available to help recharge the memory array but will need to be recharged themselves.

In addition, the 1/N recently disconnected source lines 120<1> will not participate in the recharging since they are disconnected. Thus, only (N–2)/N of the source lines 120 will participate in the recharging and they will have to recharge at least the previously active read lines, the previously disconnected source lines 120<0> and any other bit lines which are not fully charged. In the example of N=4 (as shown in the drawings), only ½ of the source lines 120, rather than the usual ¾, will participate in the recharging.

The circuit 102b of FIG. 4 solves the above-described problem. The circuit 102b is similar to circuit 102a of FIG. 3 except that it also includes byte pull-up transistors (BP) 128 each connected between the CNBL line and one of the BS transistors 124. The BP transistors 128 are controlled by bsb<j> signals which are the opposite of the bs<j> signals. Thus, when a BS transistor 124 is active, its corresponding BP transistor 128 is inactive and vice versa.

When a BS transistor 124 is active, it pulls its disconnected source line 120 to ground. For the source line labeled A, the corresponding BS transistor 124 is the one labeled 124a. The remaining BS transistors 124 which are inactive correspond to the remaining disconnected source lines 120<0>. The BP transistors 128 corresponding to the inactive BS transistors 124 are active and they maintain the voltage level or slowly pre-charge their corresponding source lines 120<0> if the lines 120<0> have previously lost charge or have been discharged.

Thus, in the embodiment of FIG. 4, the only source lines 120<0> which are not close to or at the CNBL voltage level are the ones which are connected to the discharge transistors 126 through the active BS transistors 124. The source lines 120<1>, 120<2> and 120<3> are all connected to the CNBL line through PS transistors 110 and the non-discharged source lines 120<0> are connected to the CNBL line through their corresponding BP transistors 128. Therefore, all but 2K of the source lines 120 can participate in precharging operations.

For the 1 Mbit EPROM array example, there are 256 source lines 120. In the circuit 102b, at pre-charge, 128 source lines 120<2>, 120<3> are connected via the PS transistors 110 to the CNBL line. 64 source lines 120<1> are currently disconnected from the CNBL line due to the inactivation of their PS transistors 110; 56 of the disconnected source lines 120<1>, though, are connected back to the CNBL line through their BP transistors 128. 56 source lines 120<0> from the previous read operation are charged, as a result of the operation of the BP transistors 128. 8 source lines 120<0> are fully discharged. Thus, in the circuit 102b, only 2*K (16 in this example) source lines 120 do not participate in the recharging operation, K because they are about to be discharged (of the group of source lines 120<1>) and K because they have previously been discharged (of the group of source lines 120<0>). Therefore, pre-charging can occur faster than for the circuit of 102a.

It will be appreciated by persons skilled in the art that the present invention is not limited to what has been particularly shown and described hereinabove. Rather the scope of the present invention is defined by the claims which follow.

We claim:

1. A memory array comprising:

a multiplicity of source lines for reading;

a common bit line (CNBL);

a plurality of address decoded control signals;

a multiplicity of groups of source pull-up transistors, each source pull-up transistor connecting one of said source lines to said CNBL line, wherein each group of source pull-up transistors is controlled by one of said address decoded control signals and, when one of said address decoded control signals is inactive, its corresponding group of source pull-up transistors disconnect a group of source lines from said CNBL line;

a source decoder connected to said multiplicity of source lines for discharging a portion of said group of disconnected source lines.

2. A memory array comprising:

a multiplicity of source lines for reading;

a common bit line (CNBL);

a plurality of address decoded control signals;

a multiplicity of groups of source pull-up transistors, each source pull-up transistor connecting one of said source lines to said CNBL line, wherein each group of source pull-up transistors is controlled by one of said address decoded control signals and, when one of said address decoded control signals is inactive, its corresponding group of source pull-up transistors disconnect a group of source lines from said CNBL line;

a source decoder connected to said multiplicity of source lines for discharging a portion of said group of said disconnected source lines, wherein said source decoder comprises:

a multiplicity of groups of y-select transistors, connected to said groups of source lines, corresponding to said groups of source pull-up transistors and activatable in opposition thereto, said y-select transistors being formed into collections having one y-select transistor from each group;

a plurality of byte select transistors each connected to one collection of y-select transistors and formed into sets of byte select transistors; and a plurality of discharge transistors, each connected to one of said sets of byte select transistors and to ground, wherein activation of a group of y-select transistors, one byte select transistor and its associated discharge transistor discharges one of said source lines.

3. A memory array comprising:

a multiplicity of source lines for reading;

a common bit line (CNBL);

a plurality of address decoded control signals;

a multiplicity of groups of source pull-up transistors, each source pull-up transistor connecting one of said source lines to said CNBL line, wherein each group of source pull-up transistors is controlled by one of said address decoded control signals and, when one of said address decoded control signals is inactive, its corresponding group of source pull-up transistors disconnect a group of source lines from said CNBL line;

a source decoder connected to said multiplicity of source lines for dividing said disconnected source lines into two groups, for discharging the first group of said disconnected source lines and for connecting the second group of said disconnected source lines back to said CNBL line.

4. A memory array comprising:

a multiplicity of source lines for reading;

a common bit line (CNBL);

a plurality of address decoded control signals;

a multiplicity of groups of source pull-up transistors, each source pull-up transistor connecting one of said source lines to said CNBL line, wherein each group of source pull-up transistors is controlled by one of said address decoded control signals and, when one of said address decoded control signals is inactive, its corresponding group of source pull-up transistors disconnect a group of source lines from said CNBL line;

a source decoder connected to said multiplicity of source lines for dividing said disconnected source lines into two groups, for discharging the first group of said disconnected source lines and for connecting the second group of said disconnected source lines back to said CNBL line, wherein said source decoder comprises:

a multiplicity of groups of y-select transistors, connected to said groups of source lines, corresponding to said groups of source pull-up transistors and activatable in opposition thereto, said y-select transistors being formed into collections having one y-select transistor from each group;

a plurality of byte select transistors each connected to one collection of y-select transistors and formed into sets of byte select transistors; and a plurality of byte pull-up transistors, one per byte select transistor, each connected to said CNBL line and to its corresponding byte select transistor and active when its corresponding byte select transistor is inactive; and a plurality of discharge transistors, each connected to one of said sets of byte select transistors and to ground, wherein inactivation of a group of source pull-up transistors disconnects one group of source lines from the CNBL line and activation of a group of y-select, one byte select transistor and its corresponding discharge transistor discharges one of said disconnected source lines and activates the byte pull-up transistors not corresponding to the activated byte select transistors thereby connecting the remaining source lines of said group of source lines to the CNBL line.

5. A memory array comprising:

a multiplicity of memory cells;

a common bit line (CNBL);

a plurality of read lines connected to said CNBL line;

a plurality of source lines connected to said CNBL line; and pre-charging means for decoding which of said source lines to pre-charge and for discharging the source lines needed for reading selected memory cells while pre-charging, via said CNBL line, non-fully charged ones of said read lines.

6. A memory array according to claim 5 and wherein said pre-charging means comprises:

a plurality of address decoded control signals;

a multiplicity of groups of source pull-up transistors, each source pull-up transistor connecting one of said source lines to said CNBL line, wherein each group of source pull-up transistors is controlled by one of said address decoded control signals and, when one of said address decoded control signals is inactive, its corresponding group of source pull-up transistors disconnect a group of source lines from said CNBL line;

a source decoder connected to said multiplicity of source lines for discharging a portion of said group of disconnected source lines.

7. A memory array according to claim 5 and wherein said pre-charging means comprises:

a plurality of address decoded control signals;

a multiplicity of groups of source pull-up transistors, each source pull-up transistor connecting one of said source lines to said CNBL line, wherein each group of source pull-up transistors is controlled by one of said address decoded control signals and, when one of said address decoded control signals is inactive, its corresponding group of source pull-up transistors disconnect a group of source lines from said CNBL line;

a source decoder connected to said multiplicity of source lines for dividing said disconnected source lines into two groups, for discharging the first group of said disconnected source lines and for connecting the second group of said disconnected source lines back to said CNBL line.

a source decoder connected to said multiplicity of source lines for dividing said disconnected source lines into two groups, for discharging the first group of disconnected source lines which are those source lines needed for reading and for providing charge to the second group of disconnected source lines.

\* \* \* \* \*